United States Patent
Yu et al.

(10) Patent No.: US 10,638,642 B1
(45) Date of Patent: Apr. 28, 2020

(54) HEAT SINK AND ELECTRONIC DEVICE USING THE SAME

(71) Applicants: Tsinghua University, Beijing (CN); HON HAI PRECISION INDUSTRY CO., LTD., New Taipei (TW)

(72) Inventors: Wei Yu, Beijing (CN); Chang-Hong Liu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/375,330

(22) Filed: Apr. 4, 2019

(30) Foreign Application Priority Data

Jan. 4, 2019 (CN) .......................... 2019 1 0009074

(51) Int. Cl.
*H05K 7/20* (2006.01)
*G06F 1/20* (2006.01)
*F28F 1/10* (2006.01)
*F28F 21/02* (2006.01)
*F28F 13/00* (2006.01)

(52) U.S. Cl.
CPC ............. *H05K 7/2039* (2013.01); *F28F 1/10* (2013.01); *F28F 21/02* (2013.01); *G06F 1/20* (2013.01); *F28F 2013/001* (2013.01); *F28F 2255/20* (2013.01)

(58) Field of Classification Search
CPC .. H05K 7/2039; F28F 1/10; F28F 1/20; F28F 2013/001; F28F 2255/20
USPC ........................................................ 361/705
See application file for complete search history.

(56) References Cited

U.S. PATENT DOCUMENTS

| | | | | |
|---|---|---|---|---|
| 6,432,320 | B1 * | 8/2002 | Bonsignore | B82Y 30/00 165/10 |
| 6,856,016 | B2 * | 2/2005 | Searls | B82Y 10/00 165/185 |
| 6,891,724 | B2 * | 5/2005 | De Lorenzo | B82Y 10/00 165/185 |
| 6,965,513 | B2 * | 11/2005 | Montgomery | B82Y 10/00 257/E23.09 |
| 7,086,451 | B2 * | 8/2006 | Leu | B82Y 10/00 165/185 |
| 7,148,512 | B2 * | 12/2006 | Leu | B82Y 10/00 257/77 |
| 7,180,179 | B2 * | 2/2007 | Mok | H01L 23/427 257/675 |
| 7,253,442 | B2 * | 8/2007 | Huang | H01L 23/373 257/77 |

(Continued)

OTHER PUBLICATIONS

Applied Sciences Article "Comparative Effectiveness of Different Phase Change Materials to Improve Cooling Performance of Heat Sinks for Electronic Devices", Applied Sciences, 2016, 6, 226 (Year: 2016).*

*Primary Examiner* — Anatoly Vortman
(74) *Attorney, Agent, or Firm* — ScienBiziP, P.C.

(57) ABSTRACT

A heat sink includes a carbon nanotube structure and multiple calcium chloride particles. The carbon nanotube structure includes multiple carbon nanotubes, and the carbon nanotube structure is a free-standing structure. The multiple calcium chloride particles are located on the multiple carbon nanotubes. The present application is also related to an electronic device including the heat sink.

20 Claims, 22 Drawing Sheets

(56) References Cited

U.S. PATENT DOCUMENTS

| | | | | |
|---|---|---|---|---|
| 7,609,520 B2* | 10/2009 | Chang | ............... | F28D 15/0233 |
| | | | | 165/104.33 |
| 8,587,945 B1* | 11/2013 | Hartmann | ......... | H05K 7/20454 |
| | | | | 361/679.53 |
| 9,562,284 B2* | 2/2017 | Dhinojwala | ............ | C23C 16/01 |
| 2003/0151030 A1* | 8/2003 | Gurin | .................... | B82Y 10/00 |
| | | | | 252/502 |
| 2004/0069454 A1* | 4/2004 | Bonsignore | ........... | B82Y 30/00 |
| | | | | 165/104.15 |
| 2005/0207120 A1* | 9/2005 | Tseng | .................. | H01L 23/427 |
| | | | | 361/700 |
| 2007/0001310 A1* | 1/2007 | Hua | ....................... | C09K 5/14 |
| | | | | 257/762 |
| 2010/0224354 A1* | 9/2010 | Dooley | ............... | B32B 37/025 |
| | | | | 165/185 |
| 2011/0030938 A1* | 2/2011 | Liu | ....................... | F28F 21/02 |
| | | | | 165/185 |
| 2016/0141225 A1* | 5/2016 | Roemmler | ......... | H01L 23/4275 |
| | | | | 257/702 |
| 2016/0223269 A1* | 8/2016 | Hartmann | ........... | H01L 23/4275 |
| 2016/0376486 A1* | 12/2016 | Atieh | ..................... | C09K 5/10 |
| | | | | 165/104.19 |

* cited by examiner

HEAT SINK AND ELECTRONIC DEVICE USING THE SAME

CROSS-REFERENCE TO RELATED APPLICATIONS

This application is related to commonly-assigned application entitled, "CLOTH USING HEAT SINK, AND CLOTHES AND MOUTH MASK USING THE CLOTH", concurrently filed Ser. No. 16/375,340, entire contents of which are incorporated herein by reference.

FIELD

The present application relates to a heat sink and an electronic device using the same.

BACKGROUND

As high power chips (such as CPU and DRAM) used in electronic and microelectronic devices are becoming increasingly dense and compact, there is a need for smaller and more efficient heat-dissipation structure due to the excessive on-chip heat generation. Take Intel Core i7 860 processor as example, whose thermal design power is 95 W, and its power density is higher than 30 W/cm². In comparison, a 60 W light bulb's power density is about 0.5 W/cm². Such power density leads to highly localized heating of chips in areas known as "hot spots." As the power density of chips increases, the number of "hot spots" on the surface of chips increases accordingly. Cooling chips are necessary to prevent degradation of the electronic and microelectronic devices and achieve the best device performance.

A heat-dissipation channel can be used to dissipate the heat. The material of the heat-dissipation channel is mainly metal, such as copper or aluminum. However, using metal as heat-dissipation material in electronic devices has some disadvantages such as high material density and complicated manufacturing process.

In addition, a graphite-containing composite film can be used to dissipate the heat. However, using the graphite-containing composite film as heat-dissipation material in smart phone has drawbacks such as low thermal conductivity and uneven heat-dissipation.

Therefore, there is room for improvement in the art.

BRIEF DESCRIPTION OF THE DRAWINGS

Implementations of the present technology will now be described, by way of embodiments, with reference to the attached figures, wherein.

DETAILED DESCRIPTION

Figure 1:
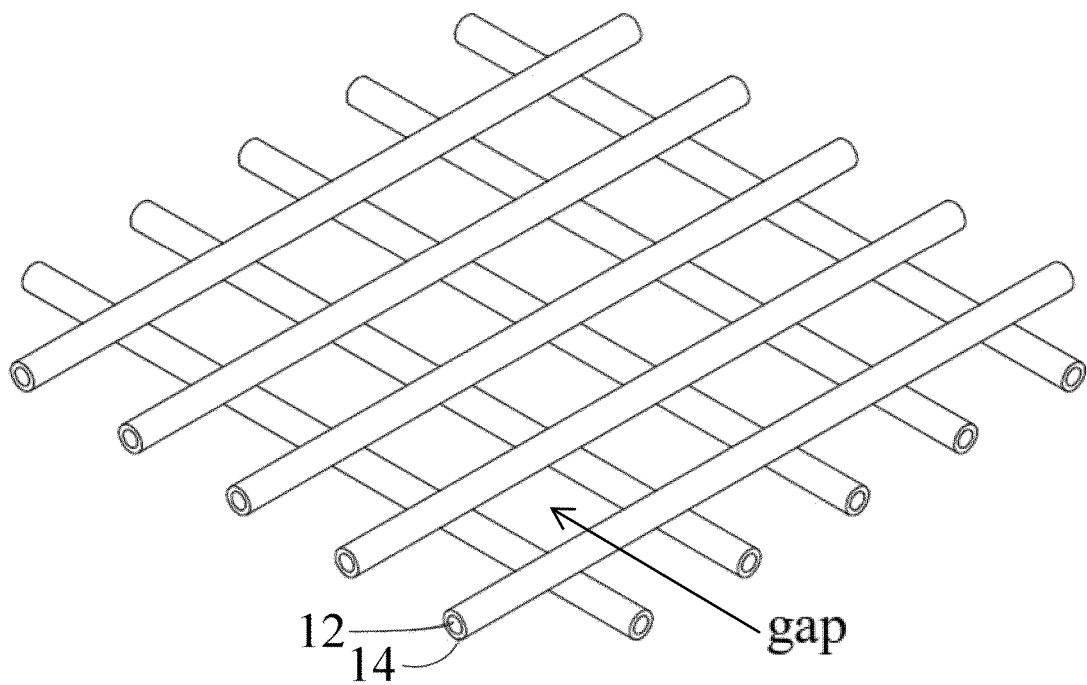
FIG. 1 shows a schematic view of a first embodiment of a heat sink.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

FIG. 1 shows a heat sink 10 of a first embodiment. The heat sink 10 includes a carbon nanotube structure 12 and a plurality of calcium chloride particles dispersed on the carbon nanotube structure 12. The carbon nanotube structure 12 is a free-standing structure and includes a plurality of carbon nanotubes. The plurality of calcium chloride particles are located on the outer surface of the plurality of carbon nanotubes to form a calcium chloride layer 14. The mass ratio of the calcium chloride particles to the plurality of carbon nanotubes is in a range from 4:1 to 64:1 ($CaCl_2$:CNT=4:1-64:1). The calcium chloride particles can be anhydrous or aqueous. In one embodiment, the calcium chloride particles are calcium chloride hexahydrate particles.

The plurality of carbon nanotubes can be combined by van der Waals attractive force. The carbon nanotube structure 12 can be a substantially pure structure of the carbon nanotubes, with few impurities. The plurality of carbon nanotubes may be single-walled, double-walled, multi-walled carbon nanotubes, or their combinations. The carbon nanotubes which are single-walled have a diameter of about 0.5 nanometers (nm) to about 50 nm. The carbon nanotubes which are double-walled have a diameter of about 1.0 nm to about 50 nm. The carbon nanotubes which are multi-walled have a diameter of about 1.5 nm to about 50 nm.

The carbon nanotubes in the carbon nanotube structure 12 can be orderly or disorderly arranged. The term 'disordered carbon nanotube' refers to the carbon nanotube structure 12 where the carbon nanotubes are arranged along many different directions, and the aligning directions of the carbon nanotubes are random. The number of the carbon nanotubes arranged along each different direction can be almost the same (e.g. uniformly disordered). The carbon nanotubes can be entangled with each other.

The term 'ordered carbon nanotube' refers to the carbon nanotube structure 12 where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotube structure 12 can be at least one drawn carbon nanotube film, at least one flocculated carbon nanotube film, or at least one pressed carbon nanotube film.

Figure 2:
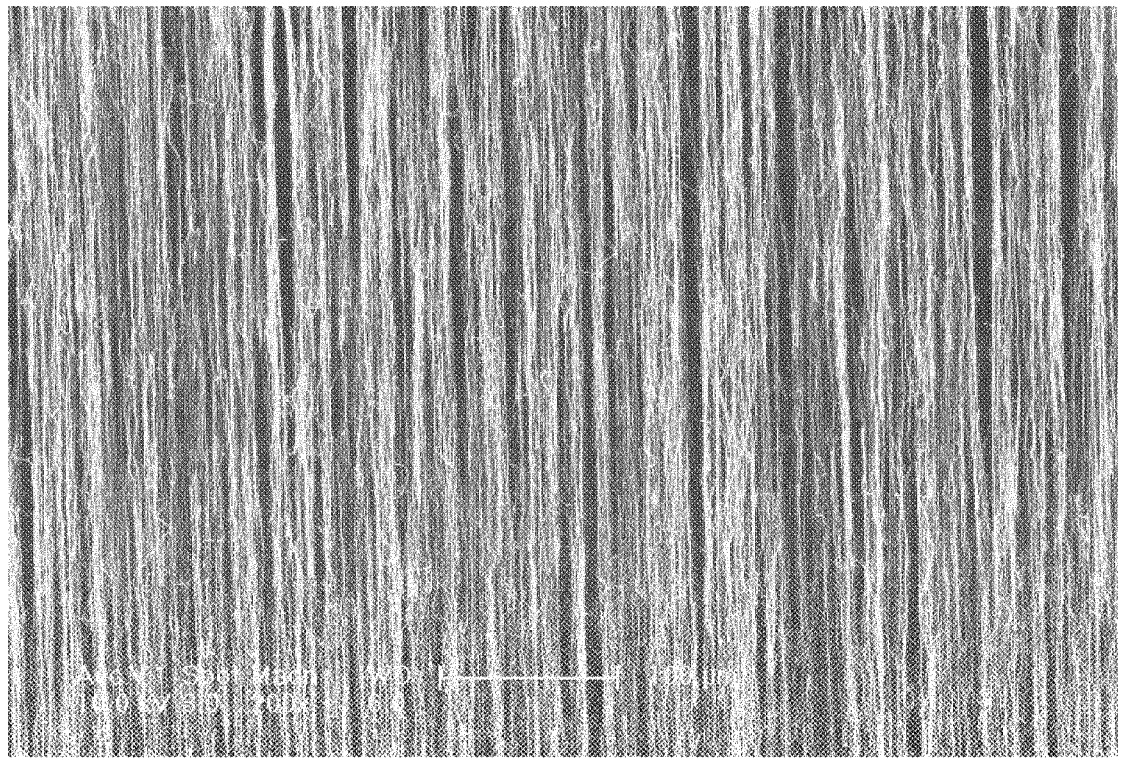
FIG. 2 is a scanning electron microscope (SEM) image of a drawn carbon nanotube film.
Figure 17:
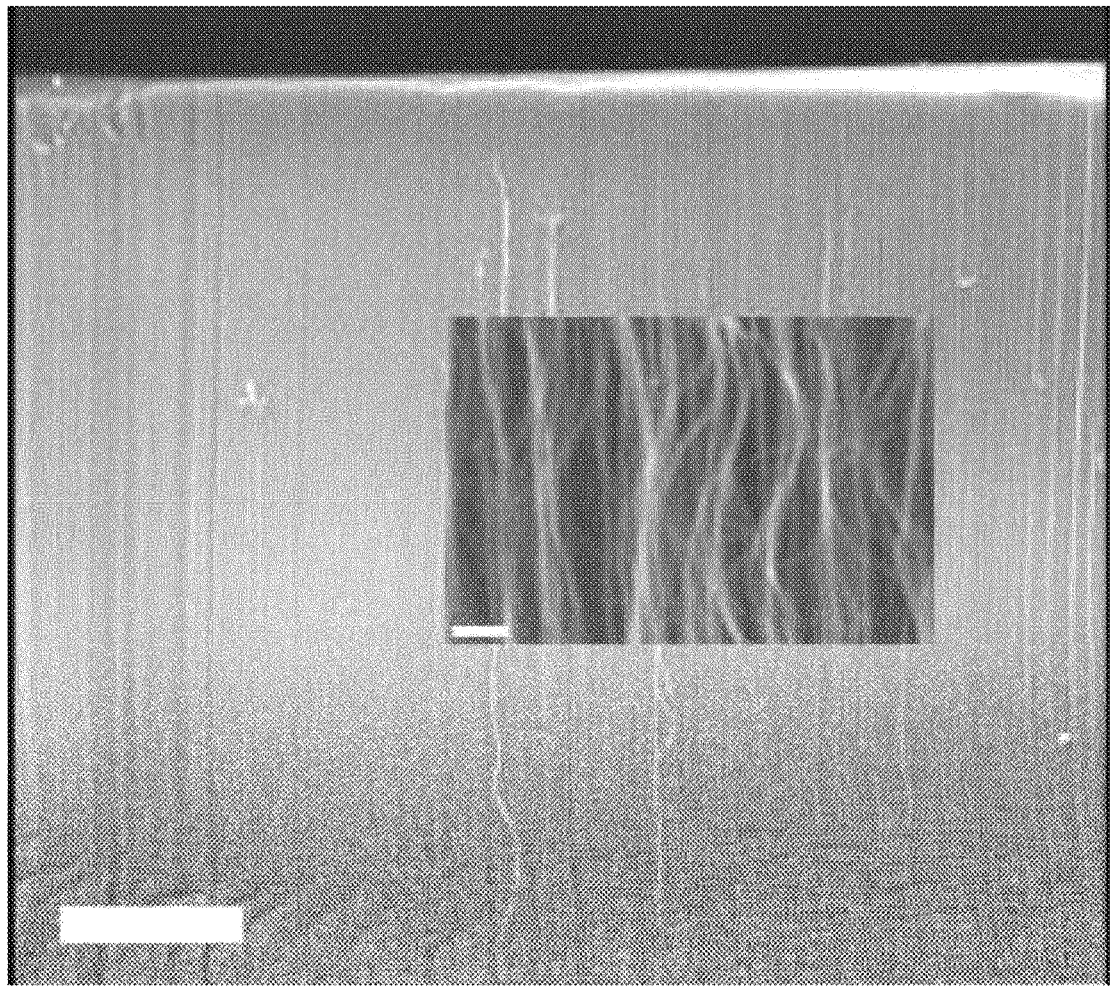
FIG. 17 is an SEM image of a carbon nanotube array.

Referring to FIG. 2, the drawn carbon nanotube film includes a plurality of successive and oriented carbon nanotubes joined end-to-end by van der Waals attractive force therebetween. The carbon nanotubes in the drawn carbon nanotube film are oriented along a preferred orientation. The carbon nanotubes are parallel to a surface of the drawn carbon nanotube film. The drawn carbon nanotube film is a free-standing film. The drawn carbon nanotube film can bend to desired shapes without breaking. A film can be drawn from a carbon nanotube array 22 to form the drawn carbon nanotube film, and the SEM image of the carbon nanotube array 22 is as shown in FIG. 17.

Figure 3:
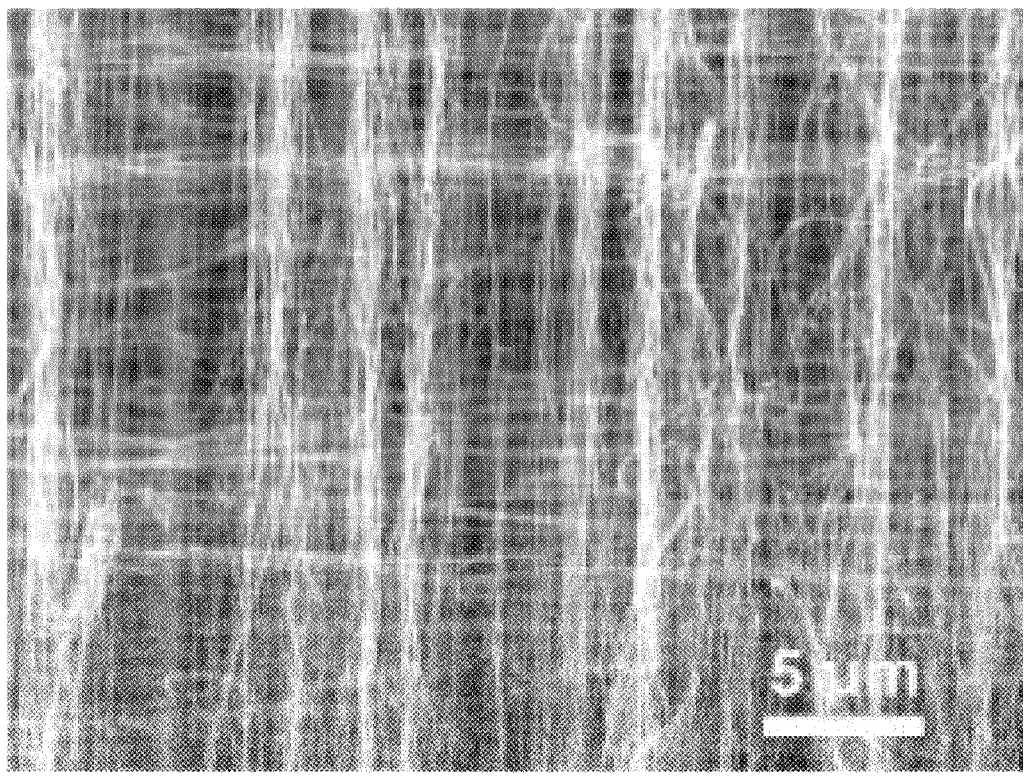
FIG. 3 is an SEM image of two drawn carbon nanotube film, and an angle between the extending directions of the carbon nanotubes in two drawn carbon nanotube films is about 90 degrees.

If the carbon nanotube structure 12 includes at least two stacked drawn carbon nanotube films, adjacent drawn carbon nanotube films can be combined by only the van der Waals attractive force therebetween. Additionally, when the carbon nanotubes in the drawn carbon nanotube film are aligned along one preferred orientation, an angle can exist between the orientations of carbon nanotubes in adjacent drawn carbon nanotube films, whether stacked or adjacent. An angle between the aligned directions of the carbon nanotubes in two adjacent drawn carbon nanotube films can be in a range from about 0 degree to about 90 degrees. In one embodiment, the carbon nanotube structure 12 consists of two drawn carbon nanotube films stacked on each other, and the angle between the length directions of the carbon nanotubes in two drawn carbon nanotube films is about 90 degrees, as shown in FIG. 3.

Figure 4:
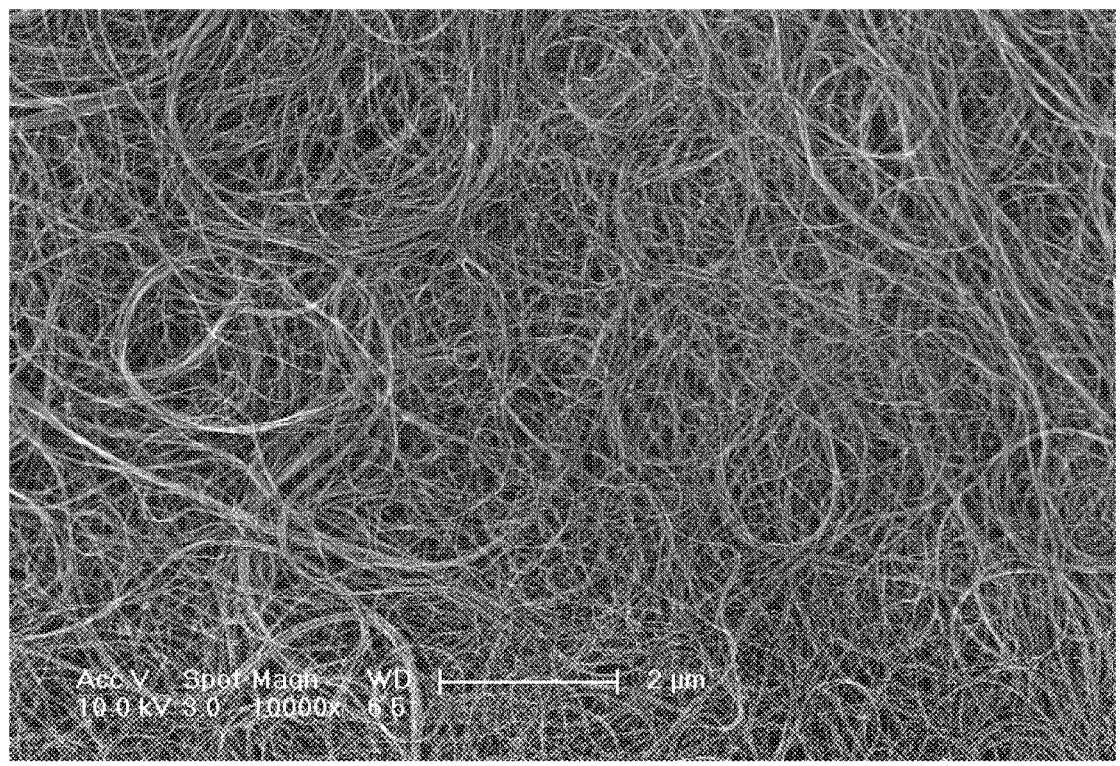
FIG. 4 is an SEM image of a flocculated carbon nanotube film.

Referring to FIG. 4, the flocculated carbon nanotube film includes a plurality of long, curved, disordered carbon nanotubes entangled with each other. The flocculated carbon nanotube film can be isotropic. The carbon nanotubes can be substantially uniformly dispersed in the flocculated carbon nanotube film. Adjacent carbon nanotubes are acted upon by van der Waals attractive force to obtain an entangled structure. Due to the carbon nanotubes in the flocculated carbon nanotube film being entangled with each other, the flocculated carbon nanotube film has excellent durability, and can be fashioned into desired shapes with a low risk to the integrity of the flocculated carbon nanotube film. Further, the flocculated carbon nanotube film is a free-standing film.

Figure 5:
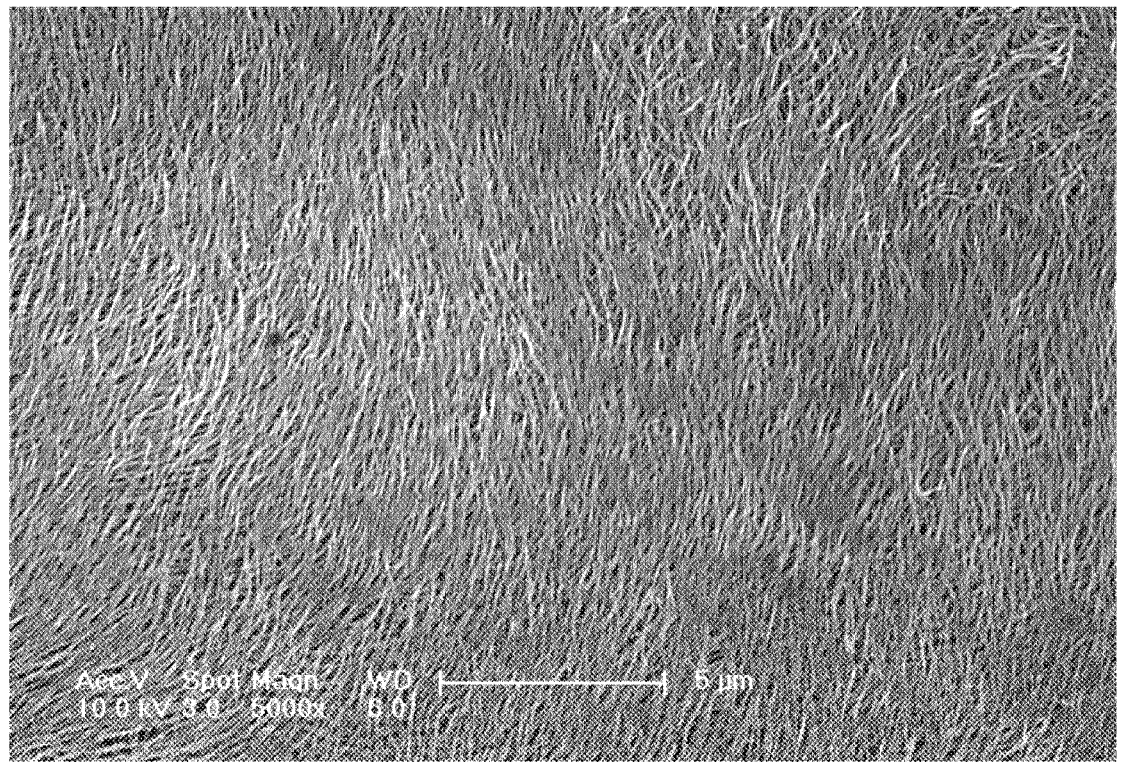
FIG. 5 is an SEM image of a pressed carbon nanotube film including a plurality of carbon nanotubes extending along approximately a same direction.
Figure 6:
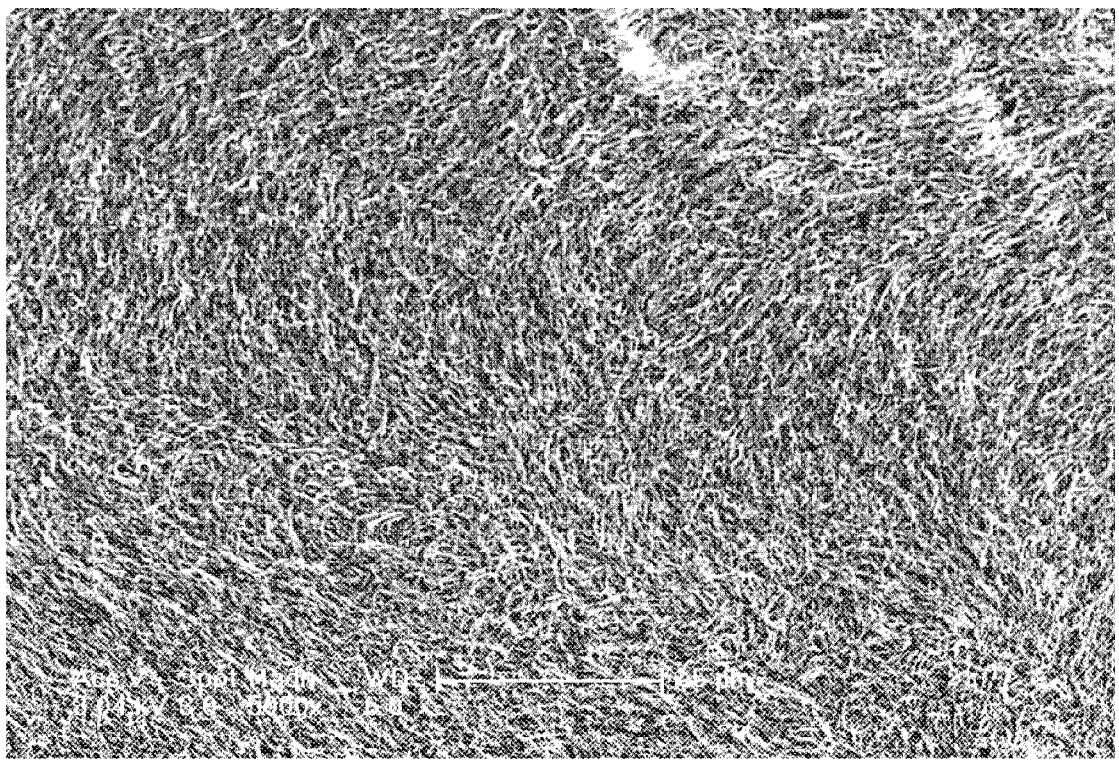
FIG. 6 is an SEM image of a pressed carbon nanotube film including a plurality of carbon nanotubes extending along different directions.

Referring to FIGS. 5 and 6, the pressed carbon nanotube film includes the plurality of carbon nanotubes. The carbon nanotubes in the pressed carbon nanotube film can be arranged along a same direction, as shown in FIG. 5. The carbon nanotubes in the pressed carbon nanotube film can be arranged along different directions, as shown in FIG. 6. The carbon nanotubes in the pressed carbon nanotube film can rest upon each other. An angle between a primary alignment direction of the carbon nanotubes and a surface of the pressed carbon nanotube film is about 0 degree to approximately 15 degrees. The greater the pressure applied, the smaller the angle obtained. If the carbon nanotubes in the pressed carbon nanotube film are arranged along different directions, the pressed carbon nanotube film can have properties that are identical in all directions substantially parallel to the surface of the pressed carbon nanotube film. Adjacent carbon nanotubes are attracted to each other and are joined by van der Waals attractive force. Therefore, the pressed carbon nanotube film is easy to bend to desired shapes without breaking. Further, the pressed carbon nanotube film is a free-standing film.

The term "free-standing" includes, but not limited to, the carbon nanotube structure 12 that does not have to be supported by a substrate. For example, the free-standing carbon nanotube structure 12 can sustain the weight of itself when it is hoisted by a portion thereof without any significant damage to its structural integrity. So, if the free-standing carbon nanotube structure 12 is placed between two separate supporters, a portion of the free-standing carbon nanotube structure 12, not in contact with the two supporters, would be suspended between the two supporters and yet maintain film structural integrity.

A method for making the heat sink 10 of the first embodiment is provided, and the method includes the following steps:

S11, dissolving the calcium chloride particles in a solvent to form a calcium chloride solution;

S12, placing the carbon nanotube structure 12 into the calcium chloride solution, ultrasonic oscillating to form a first carbon nanotube composite structure, wherein the carbon nanotube structure 12 still maintains a film-shaped structure without breaking during ultrasonic oscillating; and S13, separating the first carbon nanotube composite structure from the solvent and drying the first carbon nanotube composite structure, to form the heat sink 10.

During step S11, in one embodiment, the solvent is water.

During step S12, the ultrasonic power is in a range from about 100 watts to about 150 watts, and the oscillation time is in a range from about 10 minutes to about 20 minutes. The purpose of ultrasonic oscillating is to promote the calcium chloride particles to entry the interior of the carbon nanotube structure 12. Thus, the calcium chloride particles are located between adjacent carbon nanotubes. The carbon nanotube structure 12 is the drawn carbon nanotube film, the flocculated carbon nanotube film, or the pressed carbon nanotube film. The carbon nanotube structure 12 still maintains a film-shaped structure by controlling the ultrasonic power and the oscillation time.

During step S13, the methods for separating the first carbon nanotube composite structure from the solvent and drying the first carbon nanotube composite structure are not limited.

The different samples are provided and these samples are tested.

Sample 1

The sample 1 is a two-layer cross stacked drawn carbon nanotube film (hereinafter CSCNT film), and the angle between the length directions of the carbon nanotubes in two drawn carbon nanotube films is about 90 degrees. Thus, the sample 1 consists of the plurality of carbon nanotubes.

Sample 2

Figure 7:
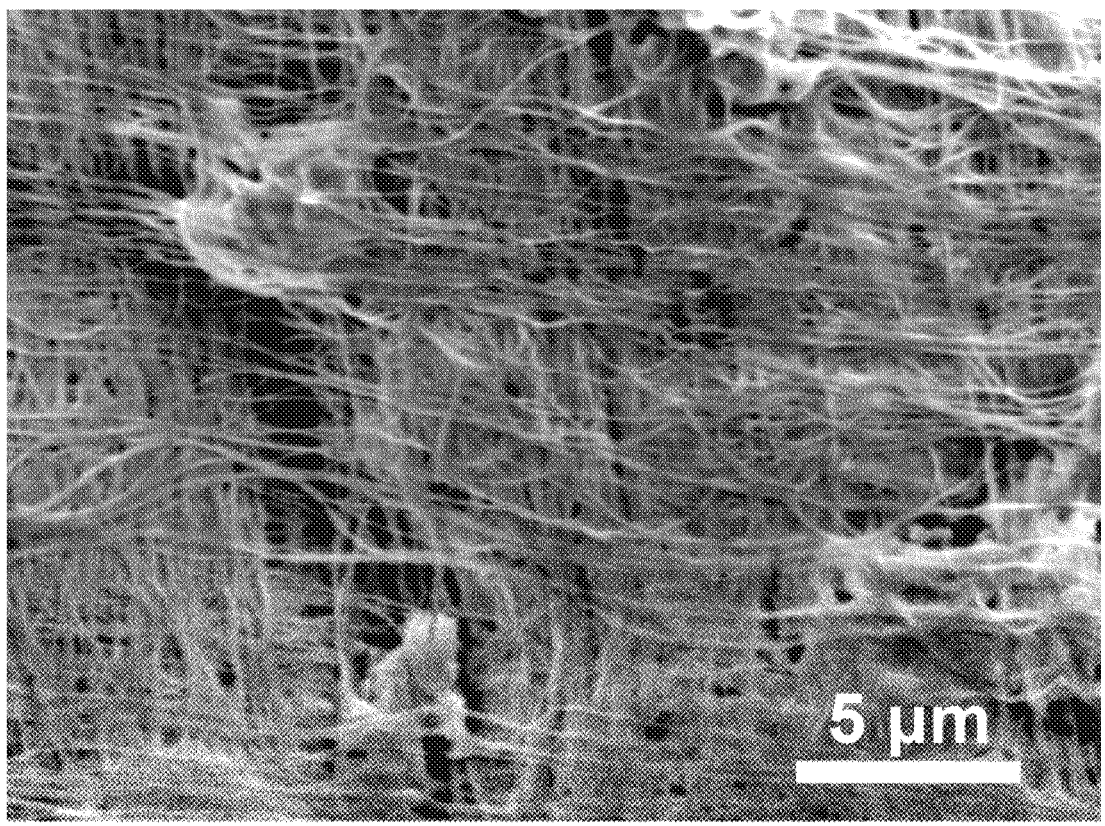
FIG. 7 is an SEM image of the first embodiment of a $CaCl_2$/CSCNT composite film.
Figure 8:
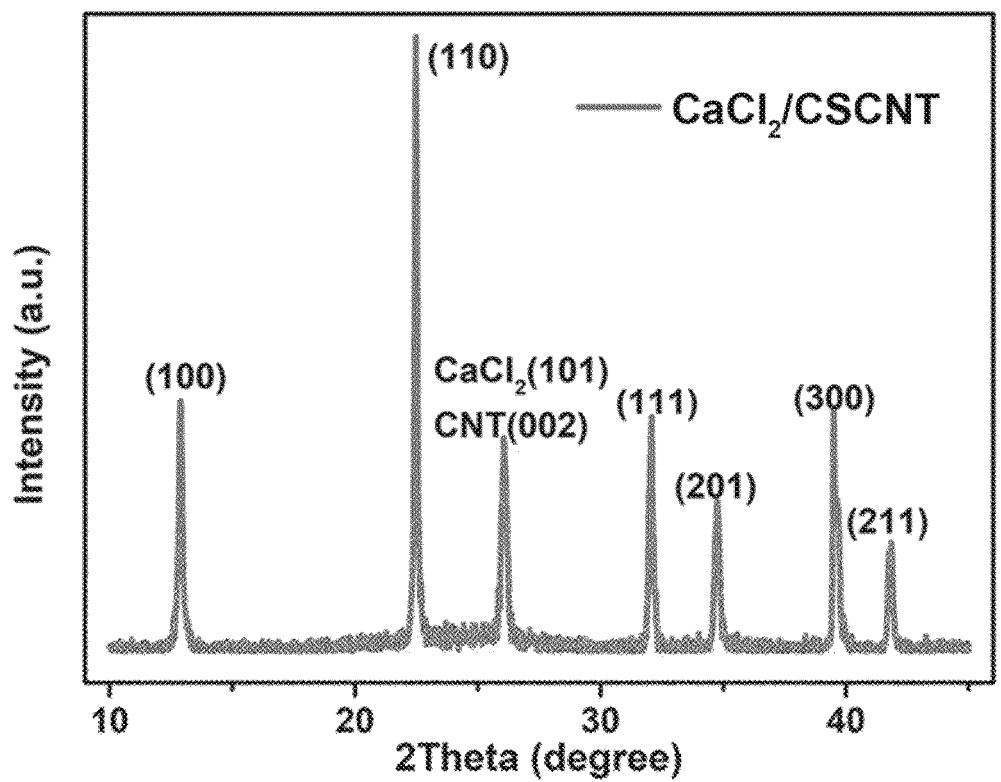
FIG. 8 is a X-ray diffraction (XRD) spectrum of the first embodiment of the $CaCl_2$/CSCNT composite film.

The sample 2 is a $CaCl_2$/CSCNT composite film and made by following steps. The CSCNT film is fully immersed in 1 M (mol per liter) $CaCl_2$ solution, to form a CSCNT/$CaCl_2$ solution. The CSCNT/$CaCl_2$ solution is first ultrasonic oscillated for 15 minutes, and then dried at 60° C. for 6 hours. Thus, the $CaCl_2$/CSCNT composite film is formed, as shown in FIG. 7. The ultrasonic power is about 125 watts. In the $CaCl_2$/CSCNT composite film, $CaCl_2$:CNT (mass ratio)=63.42:1. FIG. 8 shows a X-ray diffraction (XRD) spectrum of the $CaCl_2$/CSCNT composite film. It can be seen from XRD that each nanoparticle crystals on the CSNCT film is $CaCl_2.6H_2O$. Thus, the sample 2 consists of carbon nanotubes and the calcium chloride hexahydrate particles, and the calcium chloride hexahydrate particles are located on each carbon nanotube. The sample 2 consists of the calcium chloride hexahydrate particles and two drawn carbon nanotube films stacked on each other, and the angle between the length directions of the carbon nanotubes in two drawn carbon nanotube films is about 90 degrees.

Sample 3

The sample 3 is a $CaCl_2$/Buckypaper composite film and made by following steps. The flocculated carbon nanotube film is fully immersed in 1 M $CaCl_2$ solution, to form a $CaCl_2$/Buckypaper solution. The $CaCl_2$/Buckypaper solution is first ultrasonic oscillated for 15 minutes, and then dried at 60° C. for 6 hours. Thus, the $CaCl_2$/Buckypaper composite film is formed. The ultrasonic power is about 125 watts. In the $CaCl_2$/Buckypaper composite film, $CaCl_2$:CNT (mass ratio)=4.27:1. Thus, the sample 3 consists of the plurality of carbon nanotubes entangled with each other and the calcium chloride hexahydrate particles, and the calcium chloride hexahydrate particles are located on the plurality of carbon nanotubes.

Sample 4

The sample 4 are $CaCl_2$/MWNT (multi-walled carbon nanotube) composite particles and made by following steps. The pipe diameter of the MWNT are 10-20 nm, and the length of the MWNT are 10-30 μm. The MWNT and anhydrous calcium chloride particles are mixed to form a mixture, and then the mixture is grinded for 1 hour to obtain $CaCl_2$/MWNT composite particles (the composite particle of $CaCl_2$ and MWNT). The different $CaCl_2$/MWNT composite particles are prepared according to the different mass ratio of MWNT to calcium chloride particles. When the mass ratio of MWNT to calcium chloride particles is 2.5:1, the $CaCl_2$/MWNT composite particles are labeled as SWS1-1. When the mass ratio of MWNT to calcium chloride particles is 2:1, the $CaCl_2$/MWNT composite particles are labeled as SWS1-2. When the mass ratio of MWNT to calcium chloride particles is 1.5:1, the $CaCl_2$/MWNT composite particles are labeled as SWS1-3. When the mass ratio of MWNT to calcium chloride particles is 1:1, the $CaCl_2$/MWNT composite particles are labeled as SWS1-4.

The CSCNT film, the $CaCl_2$/CSCNT composite film, $CaCl_2$/Buckypaper composite film, and $CaCl_2$/MWNT composite particles are analyzed from the water absorption property, water absorption capacity, and cooling performance.

Figure 9:
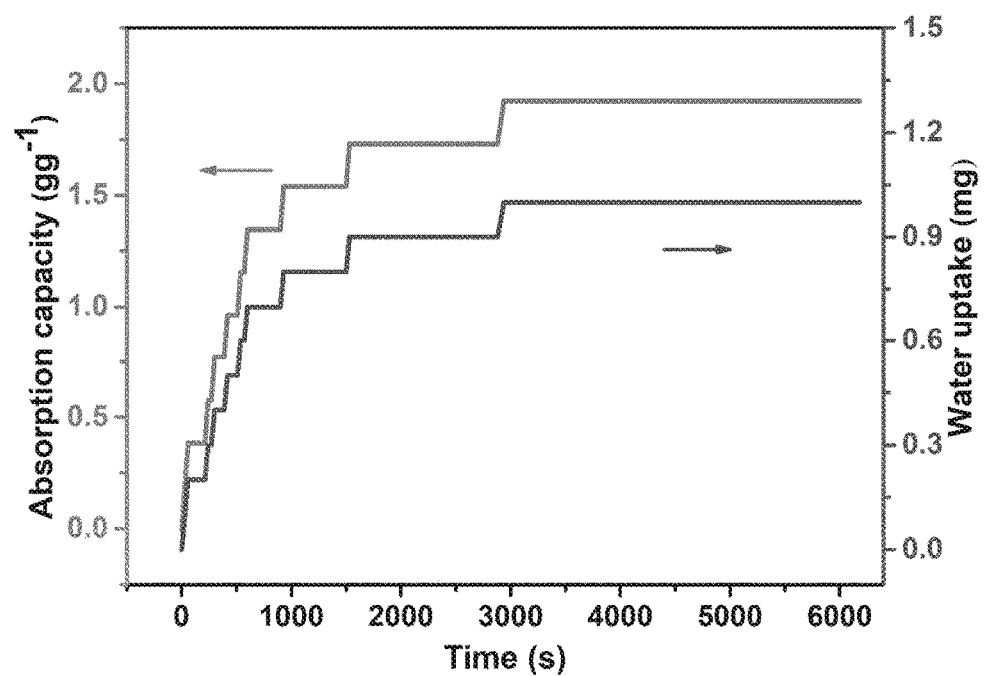
FIG. 9 is diagrams of absorption capacity vs. time and water uptake vs. time of the first embodiment of a CSCNT film.

Referring to FIG. 9, the water absorption property of the CSCNT film is measured at room temperature of 24 degrees Celsius and a humidity of 75%. It can be seen from FIG. 9 that the equilibrium adsorption capacity of the CSCNT film can reach 1.99 $gg^{-1}$. The density of the carbon nanotube is low, thus the mass of the CSCNT film with a certain volume is small. Although the adsorption capacity of the CSCNT film is high, the total water absorption of the CSCNT film is small due to the low mass of the CSCNT film. The water absorption of the 0.53 mg CSCNT film is only about 1 mg.

Figure 10:
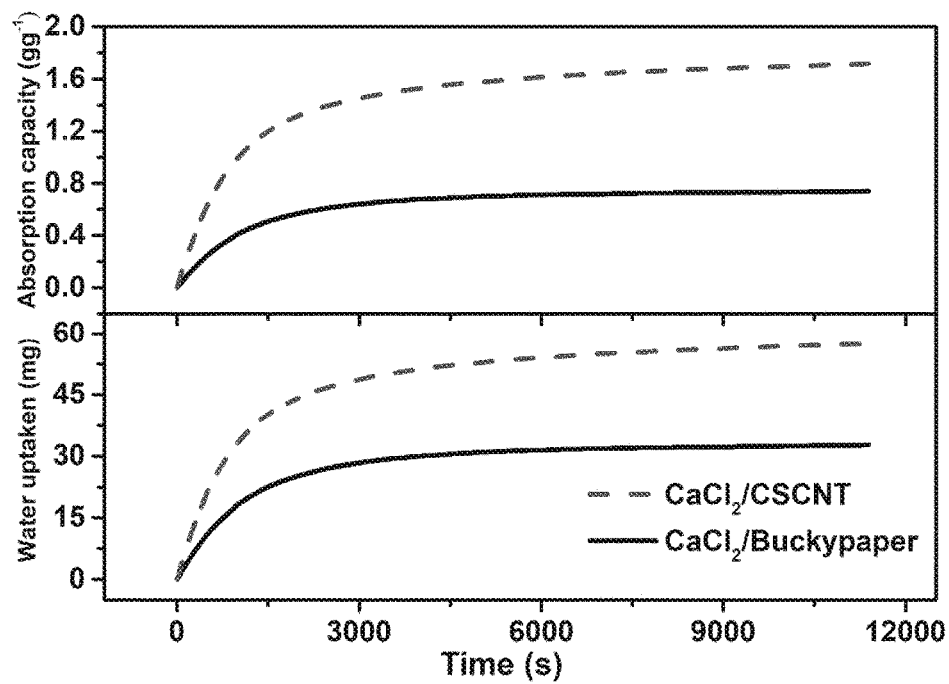
FIG. 10 is diagrams of absorption capacity vs. time and water uptake vs. time of the first embodiment of the $CaCl_2$/CSCNT composite film and a $CaCl_2$/Buckypaper composite film.

Referring to FIG. 10, the water absorption properties of the $CaCl_2$/CSCNT composite film and the $CaCl_2$/Buckypaper composite film are measured at room temperature of 24 degrees Celsius and a humidity of 65%. It can be seen from FIG. 10 that the equilibrium adsorption capacity of the $CaCl_2$/CSCNT composite film is 1.71 $gg^{-1}$, the equilibrium adsorption capacity of the $CaCl_2$/Buckypaper composite film is 0.74 $gg^{-1}$, the water adsorption of the $CaCl_2$/CSCNT composite film is 57.5 mg, and the water adsorption of the $CaCl_2$/Buckypaper composite film is 30 mg. Thus, the water absorptions of the $CaCl_2$/CSCNT composite film and the $CaCl_2$/Buckypaper composite film are better than that of the CSCNT film, and the water absorption of CSCNT film is only 1 mg.

Figure 11:
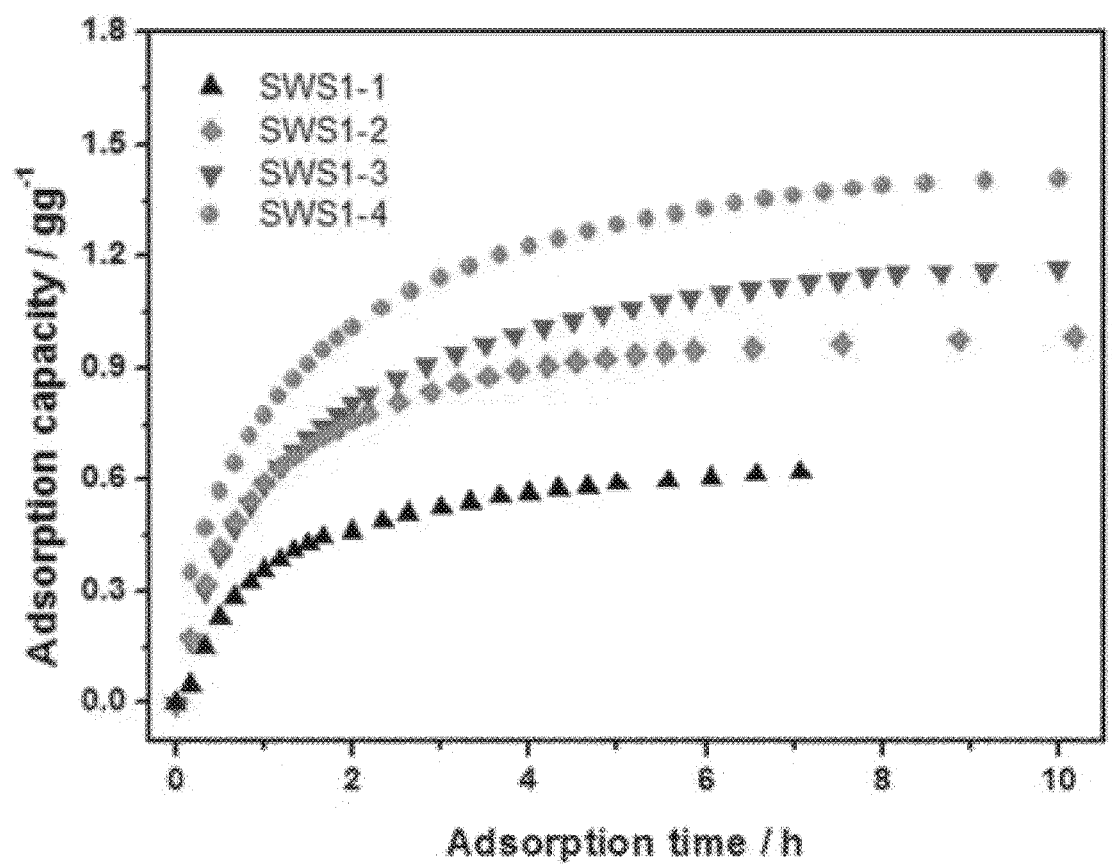
FIG. 11 is diagrams of absorption capacity vs. time of the first embodiment of $CaCl_2$/MWNT composite particles.

Referring to FIG. 11, SWS1-4 has the highest equilibrium adsorption capacity among SWS1-1 to SWS1-4, and the equilibrium adsorption capacity of the SWS1-4 is 1.41 $gg^{-1}$. The equilibrium adsorption capacity of the $CaCl_2$/CSCNT composite film is 1.71 $gg^{-1}$. Thus, the equilibrium adsorption capacity of the $CaCl_2$/CSCNT composite film is greater than that of the SWS1-4. The heat dissipation performance of the $CaCl_2$/CSCNT composite film is better than that of the $CaCl_2$/MWNT composite particles.

Figure 12:
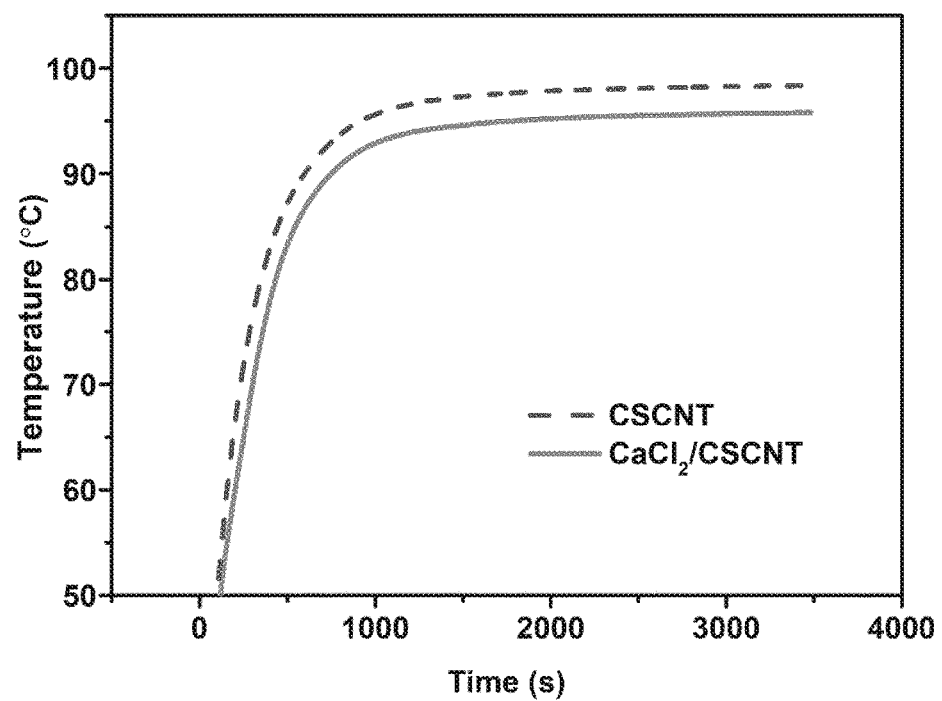
FIG. 12 is diagrams of temperature vs. time of the first embodiment of the CSCNT film and the $CaCl_2$/CSCNT composite film.
Figure 13:
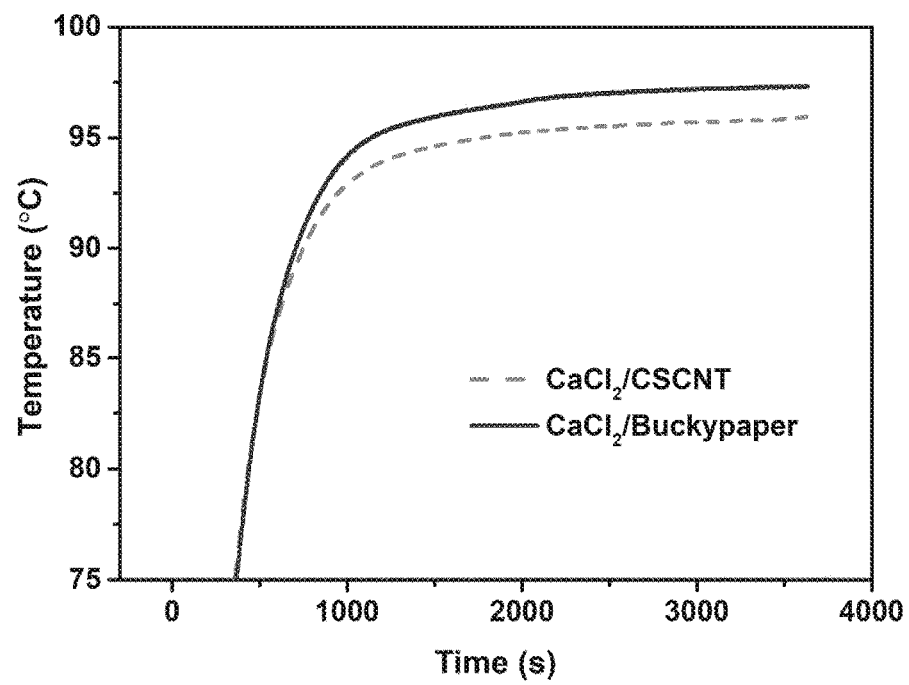
FIG. 13 is diagrams of temperature vs. time of the first embodiment of the $CaCl_2$/CSCNT composite film and the $CaCl_2$/Buckypaper composite film.

The CSCNT film, the $CaCl_2$/CSCNT composite film, and the $CaCl_2$/Buckypaper composite film are placed in a 65% humidity environment for 5 hours to ensure that the CSCNT film, the $CaCl_2$/CSCNT composite film, and the $CaCl_2$/Buckypaper composite film have sufficient water absorption. Then the CSCNT film, the $CaCl_2$/CSCNT composite film, and the $CaCl_2$/Buckypaper composite film are respectively attached to a heat source for testing the equilibrium temperatures of the CSCNT film, the $CaCl_2$/CSCNT composite film, and the $CaCl_2$/Buckypaper composite film. The lower the equilibrium temperature, the better the performance of cooling the heat source. The performance of cooling the heat source is defines as the cooling performance. Thus, the lower the equilibrium temperature, the better the cooling performance. FIG. 12 shows temperature—time curves of the CSCNT film and the CaCl$_2$/CSCNT composite film. FIG. 13 shows temperature—time curves of the CaCl$_2$/CSCNT composite film and the CaCl$_2$/Buckypaper composite film. From FIG. 12 and FIG. 13, it can bee seen that the equilibrium temperature of the CSCNT film is 98.2 degrees Celsius, the equilibrium temperature of the CaCl$_2$/CSCNT composite film is 95.9 degrees Celsius, and the equilibrium temperature of the CaCl$_2$/Buckypaper composite film is 97.3 degrees Celsius. Thus, the cooling performances of the CaCl$_2$/CSCNT composite film and the CaCl$_2$/Buckypaper composite film are better than that of the CSCNT film, and the CaCl$_2$/CSCNT composite film has the best cooling performance.

Figure 14:
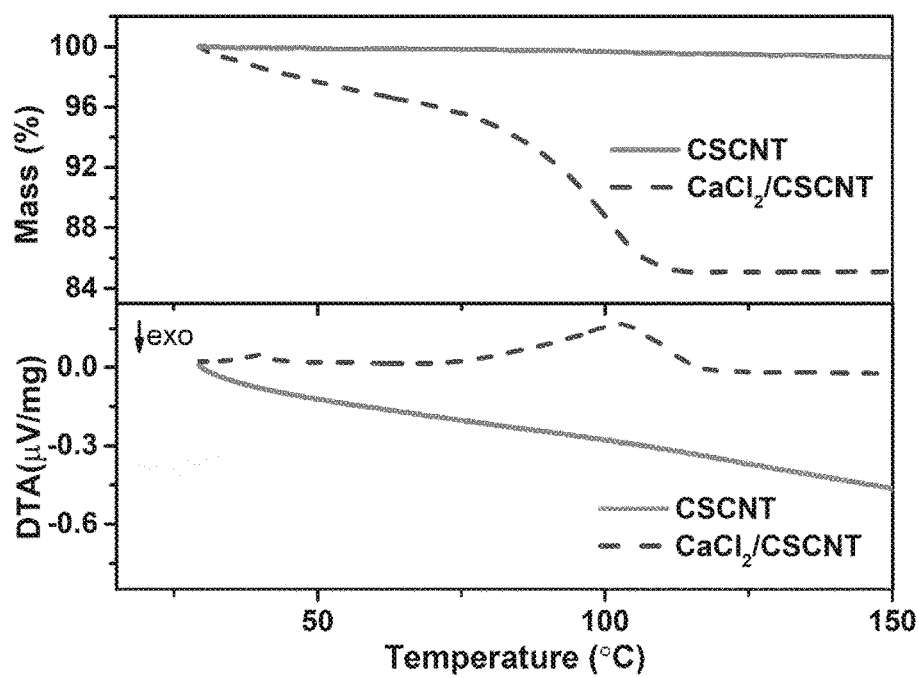
FIG. 14 is diagrams of mass vs. time and DTA vs. time of the first embodiment of the CSCNT film and the $CaCl_2$/CSCNT composite film.

Referring to FIG. 14, TG (thermogravimetric) analysis and DTA (differential thermal analysis) of the CSCNT film and the CaCl$_2$/CSCNT composite film are performed. The TG curve of the CaCl$_2$/CSCNT composite film shows that the weight loss of the CaCl$_2$/CSCNT composite film is only about 15%. The weight loss of the CaCl$_2$/CSCNT composite film is lower than the water absorption of the CaCl$_2$/CSCNT composite film. Thus, a dynamic equilibrium of water absorption and desorption of the CaCl$_2$/CSCNT composite film is achieved. The DTA curve shows that the CaCl$_2$/CSCNT composite film has an endothermic peak during heating, which confirms that the excellent cooling performance of the CaCl$_2$/CSCNT composite film is caused by water evaporation.

According to the formula of refrigeration coefficient Wc=T2/(T1−T2), the refrigeration coefficient of the CSCNT film is 10.9%, the refrigeration coefficient of the CaCl$_2$/Buckypaper composite film is 12.2%, and the refrigeration coefficient of the CaCl$_2$/CSCNT composite film is 13.8%. Thus, the CaCl$_2$/CSCNT composite film has the best refrigeration coefficient. In addition, the CaCl$_2$/CSCNT composite film has a heat dissipation coefficient of 57.63 W/m$^{-2}$ k$^{-1}$.

Figure 15:
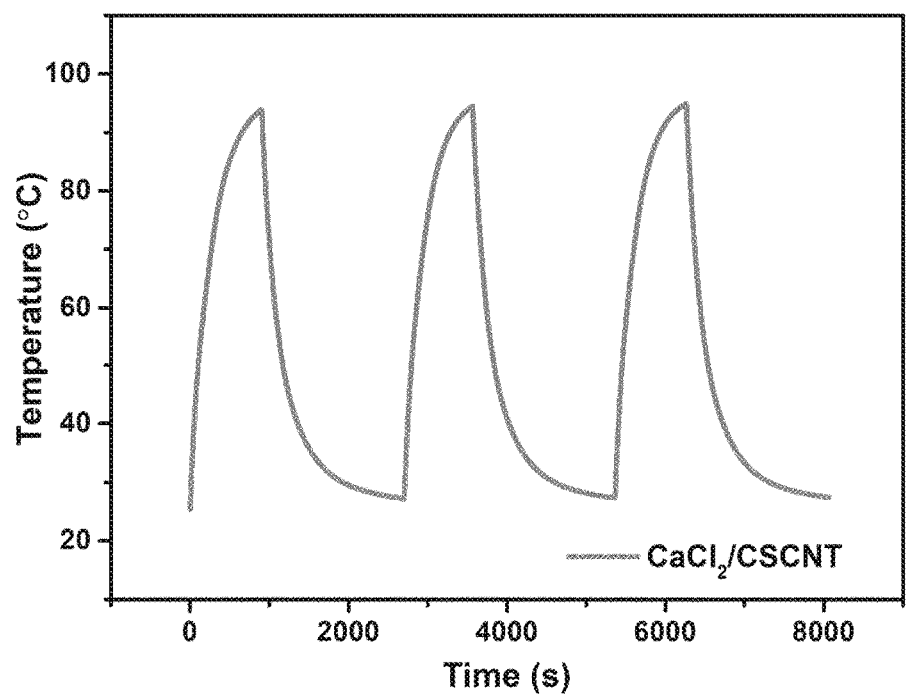
FIG. 15 is a diagram of temperature vs. time of the first embodiment of the $CaCl_2$/CSCNT composite film.

Referring to FIG. 15, the heater is continuously operated for 15 minutes at intervals of 30 minutes to heat the heat source, and the maximum temperature difference of the CaCl$_2$/CSCNT composite film in the three cycles is 9.6 degrees Celsius, 9.1 degrees Celsius, and 8.9 degrees Celsius. It can be seen that the maximum temperature differences of the CaCl$_2$/CSCNT composite film in the three cycles are almost the same, thus the CaCl$_2$/CSCNT composite film has good heat dissipation performance during the cycle heating process. Thus, the CaCl$_2$/CSCNT composite film is recyclable and can be reused.

Figure 16:
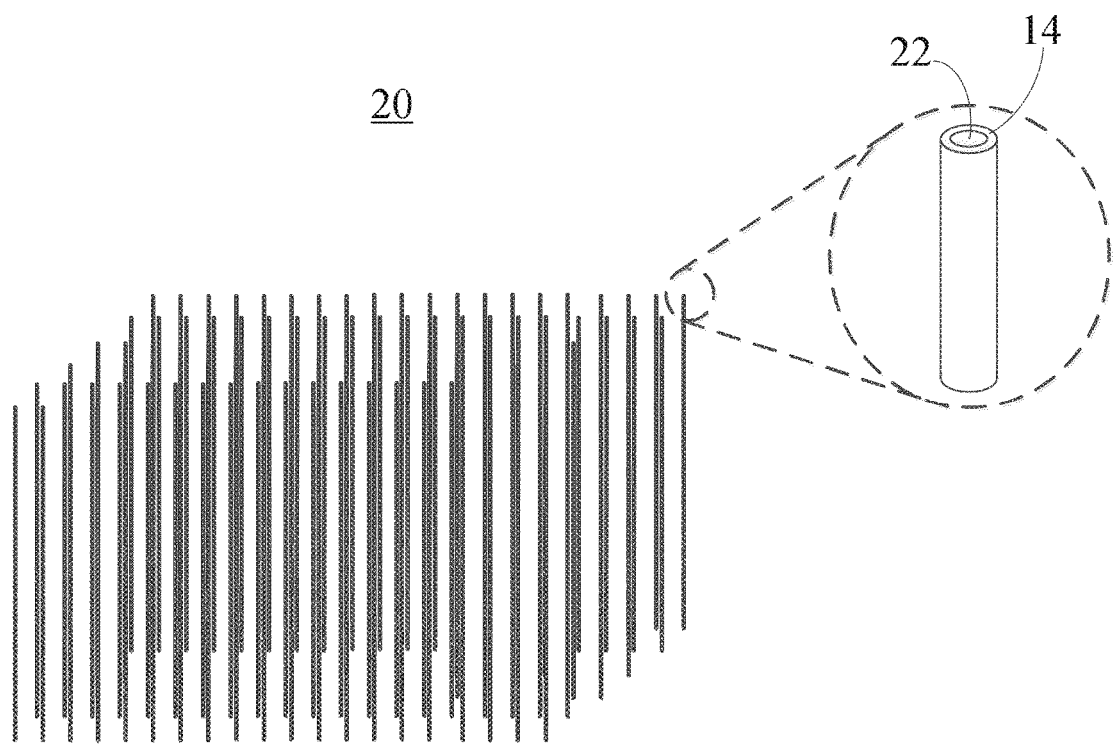
FIG. 16 shows a schematic view of a second embodiment of a heat sink.

FIG. 16 shows a heat sink 20 of a second embodiment. The heat sink 20 of the second embodiment is similar to the heat sink 10 of the first embodiment above except that extending directions of the carbon nanotubes are different from each other in the first and second embodiments. In the heat sink 10 of the first embodiment, the extending directions of the carbon nanotubes are parallel to the contact surface between the heat sinks 10, 20 and the heat source. In the heat sink 20 of the second embodiment, the extending directions of the carbon nanotubes are substantially perpendicular to the contact surface between the heat sinks 10, 20 and the heat source. In one embodiment, the carbon nanotube structure 12 is a film or sheet, the extending directions of the carbon nanotubes in the heat sink 10 are parallel to the surface of the carbon nanotube structure 12, and the extending directions of the carbon nanotubes in the heat sink 20 are substantially perpendicular to the surface of the carbon nanotube structure 12.

In the second embodiment, the carbon nanotube structure 12 is the carbon nanotube array 22. The carbon nanotube array 22 is a free-standing structure, and includes the plurality of carbon nanotubes substantially parallel to each other. The carbon nanotube array 22 is a pure carbon nanotube structure 12. A distance between adjacent two carbon nanotubes is in a range from about 0.1 nm to about 0.5 nm. In the carbon nanotube array 22, the axial or length directions of the plurality of carbon nanotubes are substantially perpendicular to the surface of the carbon nanotube array 22, as shown in FIG. 17.

A method for making the heat sink 20 of the second embodiment is provided, and the method includes one or more of the following steps:

S21, dissolving the calcium chloride particles in the solvent to form the calcium chloride solution;

S22, growing the carbon nanotube array 22 on a growth substrate, wherein the axial directions of the plurality of carbon nanotubes are substantially perpendicular to the growth substrate;

S23, placing the carbon nanotube array 22 and the growth substrate into the calcium chloride solution, ultrasonic oscillating to form a second carbon nanotube composite structure, wherein the carbon nanotube structure 12 still maintains a film-shaped structure without breaking during ultrasonic oscillating; and S24, separating the second carbon nanotube composite structure from the solvent and removing the growth substrate, to form the heat sink 20.

The method for making the heat sink 20 is similar to the method for making the heat sink 10 above except that in the first embodiment, the drawn carbon nanotube film, the flocculated carbon nanotube film, or the pressed carbon nanotube film is placed in the calcium chloride solution; and in the second embodiment, the carbon nanotube array 22 is placed in the calcium chloride solution.

The heat sinks 10 and 20 have the following characteristics: 1) the heat sinks 10, 20 includes the free-standing carbon nanotube structure 12 and the calcium chloride particles, and the free-standing carbon nanotube structure 12 can carry more calcium chloride particles, thus the heat sinks 10, 20 have good water absorption property; 2) the heat sinks 10, 20 can absorb the moisture from the air to form water and then the water is evaporated, so that the heat dissipation is achieved; 3) during the heat dissipation, the heat sinks 10, 20 can still absorb the moisture from air, thus the heat sinks 10, 20 can continuously absorb water—evaporate water—absorb water—evaporate water, so that the heat sinks 10, 20 have good heat dissipation performance and have high recyclability; 4) when the carbon nanotube structure 12 is two-layer drawn carbon nanotube film, and the angle between the length directions of the carbon nanotubes in two drawn carbon nanotube films is about 90 degrees, the carbon nanotube structure 12 can carry more calcium chloride particles, CaCl$_2$:CNT (mass ratio)=63.42:1, and the heat dissipation coefficient of the heat sink 10 is 57.63 W/m$^{-2}$ k$^{-1}$.

Figure 18:
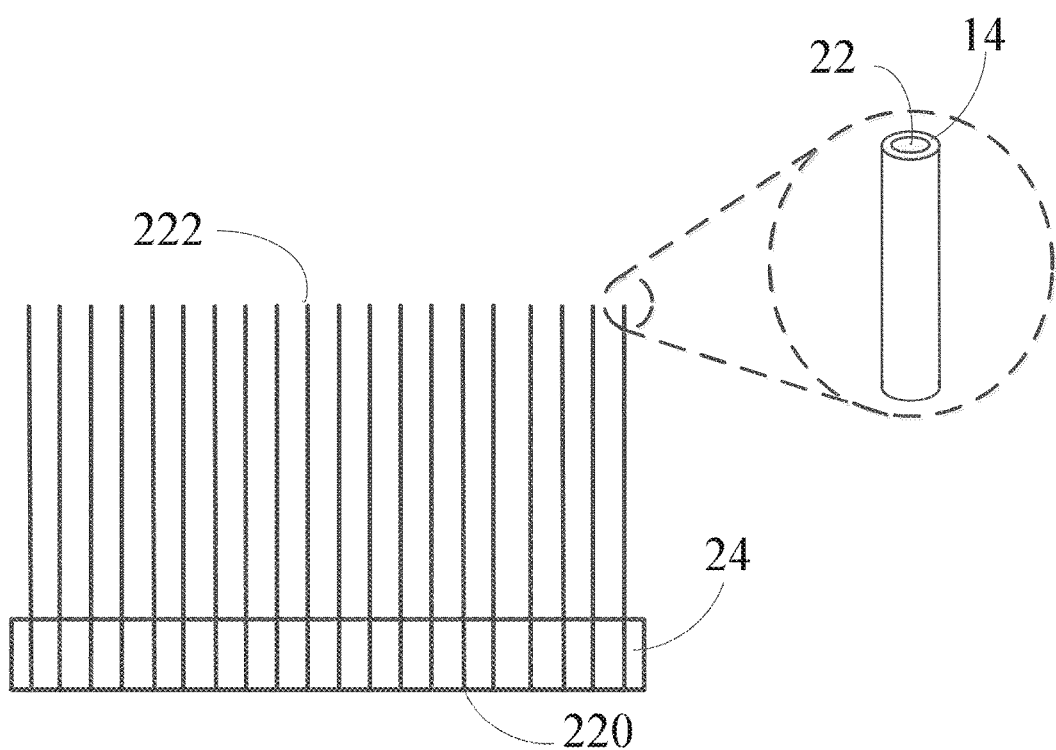
FIG. 18 shows a cross-section schematic view of a third embodiment of a heat sink.

FIG. 18 shows a heat sink 30 of a third embodiment. The heat sink 30 of the third embodiment is similar to the heat sink 20 of the second embodiment above except that the heat sink 30 further includes a fixing layer 24 located at one end of each carbon nanotube of the carbon nanotube array 22.

In the third embodiment, the carbon nanotube array 22 has a first surface 220 and a second surface 222 opposite to the first surface 220. When the carbon nanotube array 22 is not stripped from the growth substrate, the second surface 222 is in direct contact with the growth substrate, and the first surface 220 is away from the growth substrate. The carbon nanotubes of the carbon nanotube array 22 extend from the first surface 220 to the second surface 222, and the length directions of the carbon nanotubes are substantially perpendicular to the second surface 222. The fixing layer 24 is located at a position close to the first surface 220. Each carbon nanotube has a first end and a second end opposite to the first end, the first ends of the carbon nanotubes form the first surface 220, and the second ends of the carbon nanotubes form the second surface 222. In one embodiment, the first ends of the carbon nanotubes are located in the fixing layer 24. In another embodiment, the first ends of the carbon nanotubes can pass through and be exposed from the fixing layer 24. The second ends of the carbon nanotubes extend along a direction away from the fixing layer 24. A portion of each carbon nanotube near the first end is covered by the fixing layer 24, and the rest of each carbon nanotube is coated with the calcium chloride hexahydrate particles. Thus, the heat sink 30 consists of the carbon nanotube array 22, the calcium chloride hexahydrate particles, and the fixing layer 24. The calcium chloride hexahydrate particles form the calcium chloride layer 14. The calcium chloride layer 14 can be a discontinuous layered structure or a continuous layered structure. The portion of each carbon nanotube exposed from the fixing layer 24 is defined as a first portion, and the portion of each carbon nanotube embedded in the fixing layer 24 is defined as a second portion. In one embodiment, the calcium chloride layer 14 is the continuous layered structure and covers the outer surfaces of the first portions.

In the heat sink 30, the calcium chloride layers 14 of adjacent carbon nanotubes can be in direct contact with or spaced apart from each other. In one embodiment, the calcium chloride layers 14 of adjacent carbon nanotubes are spaced apart from each other, each carbon nanotube and the calcium chloride layer 14 located on the outer surface of the carbon nanotube form a composite tubular structure. The composite tubular structures are spaced apart from each other, thereby increasing air circulation and improving heat dissipation efficiency.

The material of the fixing layer 24 is thermal conductive, such as conductive polymer or low melting point metal. The low melting point metal can be tin, silver, lead, and so on. The fixing layer 24 should be designed to have suitable thickness so that the heat sink 30 can achieve a required performance. If the fixing layer 24 is too thin, the fixing force to the carbon nanotube array 22 will be reduced, causing the carbon nanotube array 22 to be tilted. If the fixing layer 24 is too thick, the heights of first portions are too small, affecting the attachment of more calcium chloride particles, thereby affecting the heat dissipation performance of the heat sink 30. The lengths of the second portions are less than that of first portions. In one embodiment, the thickness of the fixing layer 24 is in a range from about 0.1 mm to about 1 mm. The melting point of the fixing layer 24 is less than the temperature of the heat source.

In addition to the characteristics of the heat sinks 10 and 20, the heat sink 30 has the other following characteristics: 1) the fixing layer 24 can cause the carbon nanotube array 22 not to be tilted, thus the length directions of the carbon nanotubes of the carbon nanotube array 22 can be kept substantially perpendicular to the surface of the heat source when the heat sink 30 is in use. The heat is transferred to the calcium chloride particles along the axial direction of the carbon nanotubes, maximizing the axial thermal conductivity of the carbon nanotubes, thereby improving the heat dissipation performance of the heat sink 30; 2) in the process of growing the carbon nanotube array 22, it is difficult to make all the carbon nanotubes have the same height. When the carbon nanotube array 22 is located on the heat source, the first surface 220 is difficult to closely adhere to the surface of the heat source because the first surface 220 is not smooth enough. There is always a gap between the first end of each carbon nanotube and the surface of the heat source, which affects heat transfer from the heat source to the carbon nanotube array 22. In the third embodiment, the heat of the heat sink 30 can heat the fixing layer 24 to be a molten state, because the melting point of the fixing layer 24 is less than the temperature of the heat source. The fixing layer 24 in the molten state can fill the gap between the first end of each carbon nanotube and the surface of the heat source. The thermal conductivity of the fixing layer 24 is better than that of the air in the gap, thereby improving the heat dissipation performance of the heat sink 30.

A method for making the heat sink 30 of the third embodiment is provided, and the method includes one or more of the following steps:

S31, dissolving the calcium chloride particles in the solvent to form the calcium chloride solution;

S32, growing the carbon nanotube array 22 on the growth substrate, wherein the axial directions of the plurality of carbon nanotubes are substantially perpendicular to the growth substrate, and the carbon nanotube array 22 has the first surface 220 and the second surface 222 opposite to the first surface 220;

S33, inserting the first surface 220 of the carbon nanotube array 22 into the fixing layer 24 in the molten state, and cooling to solidify the fixing layer 24;

S34, removing the growth substrate by chemical etching, mechanical grinding, or knife cutting, to obtain a composite structure of the carbon nanotube array 22 and the fixing layer 24;

S35, placing the composite structure of the carbon nanotube array 22 and the fixing layer 24 in the calcium chloride solution, wherein entire carbon nanotube array 22 is located in the calcium chloride solution, and entire fixing layer 24 is exposed out of the calcium chloride solution;

S36, ultrasonic oscillating to form a third carbon nanotube composite structure, wherein the carbon nanotube structure 12 still maintains a film-shaped structure without breaking during ultrasonic oscillating; and S37, separating the third carbon nanotube composite structure from the solvent and drying the third carbon nanotube composite structure, to form the heat sink 30.

Figure 19:
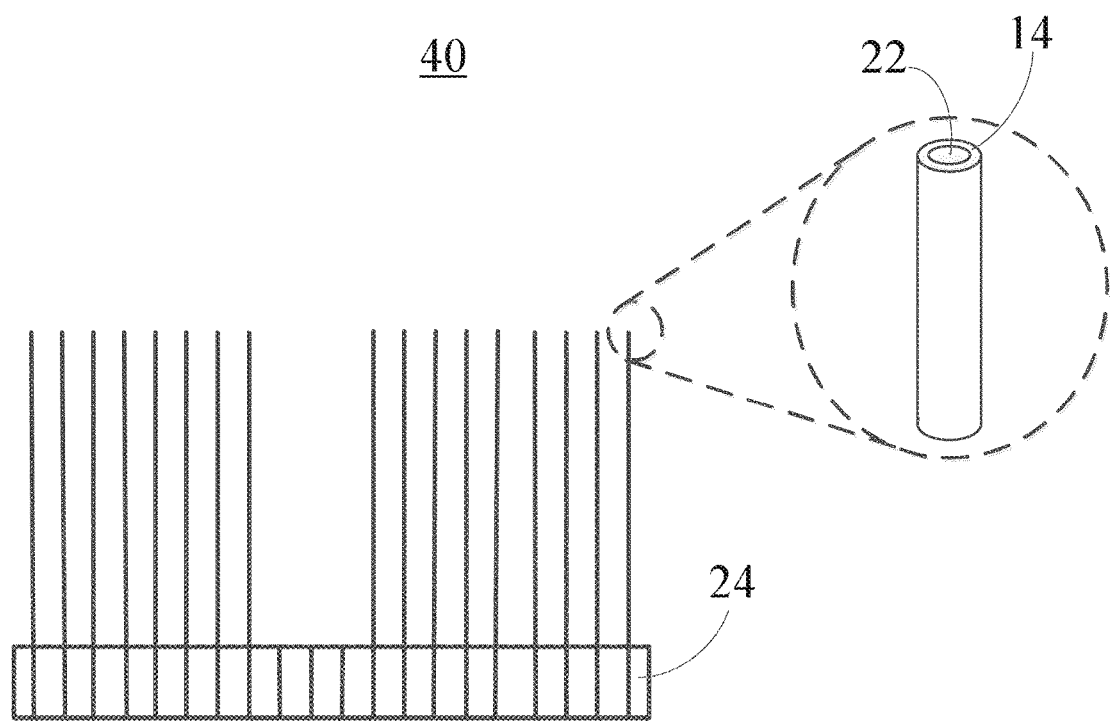
FIG. 19 shows a cross-section schematic view of a fourth embodiment of a heat sink.

FIG. 19 shows a heat sink 40 of a fourth embodiment. The heat sink 40 of the fourth embodiment is similar to the heat sink 30 of the third embodiment above except that in the heat sink 40, the first portions is a patterned carbon nanotube array.

Figure 20:
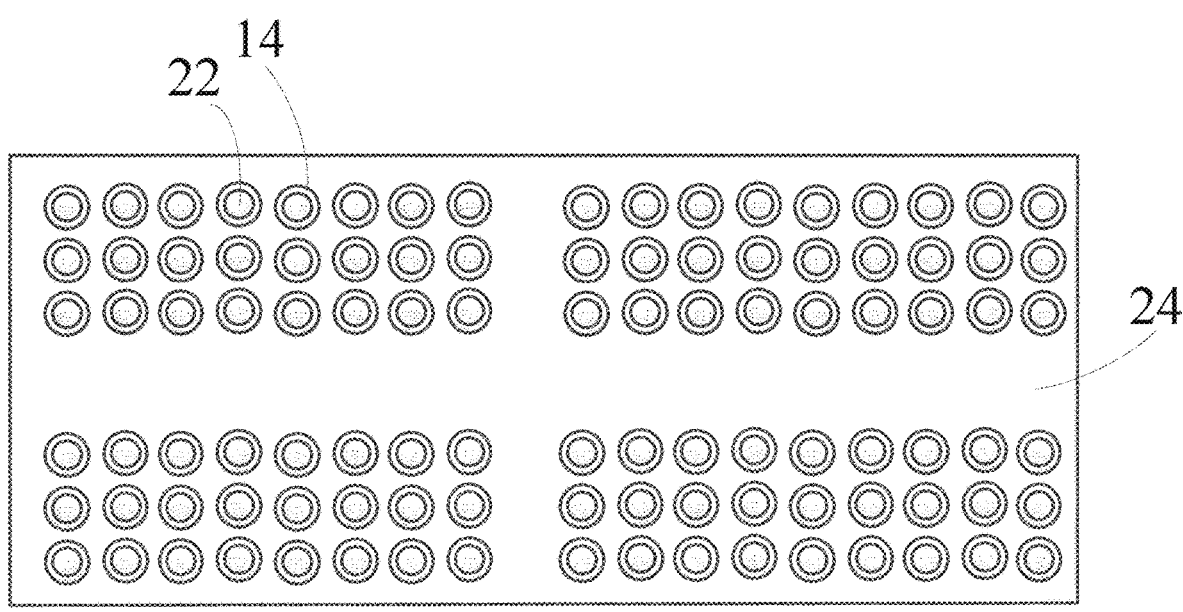
FIG. 20 shows a top schematic view of the fourth embodiment of the heat sink.

In the fourth embodiment, the first portions form a predetermined three-dimensional pattern. The three-dimensional pattern is not limited. In one embodiment, some carbon nanotubes of the first portions are removed, and the rest of the carbon nanotubes in the first portions have different lengths. Thus, a cross-shaped groove is formed, as shown in FIG. 20.

In addition to the characteristics of the heat sink 30, the heat sink 40 has the following characteristics: the patterned composite tubular structure can increase air circulation, thereby improving heat dissipation efficiency.

The method for making the heat sink 40 is similar to the method for making the heat sink 30 above except that the method for making the heat sink 40 further includes etching the first portions. The method for etching is not limited. In one embodiment, the laser etching is used for making the predetermined pattern.

Figure 21:
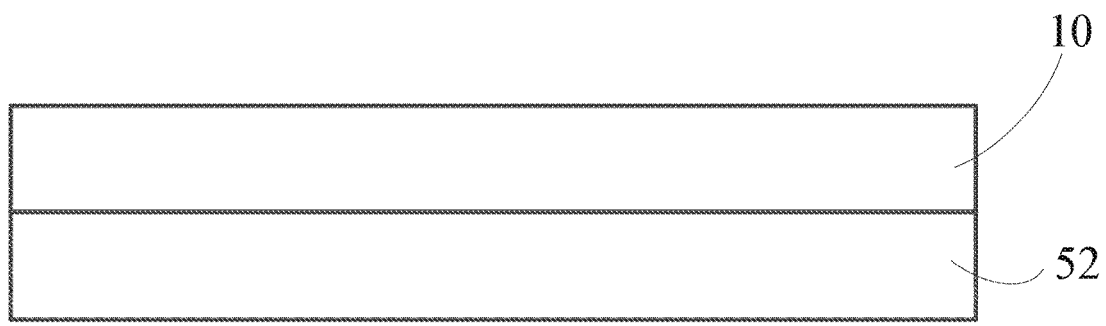
FIG. 21 shows a schematic view of a fifth embodiment of a heat sink.

FIG. 21 shows a heat sink 50 of a fifth embodiment. The heat sink 50 of the fifth embodiment is similar to the heat sink 10 of the first embodiment above except that the heat sink 50 further includes a metal plate 52, and the metal plate 52 and the heat sink 10 are stacked on each other.

When the heat sink 50 is in use, the metal plate 52 is in contact with the heat source, and the metal plate 52 is located between the heat sink 10 and the heat source. In one embodiment, the metal plate 52 is located between the $CaCl_2$/CSCNT composite film and the heat source. The area of the metal plate 52 is greater than the area of the heat source, and the area of the heat sink 10 is greater than or equal to the area of the metal plate 52. The heat of the heat source can be transmitted to the heat sink 10 via the metal plate 52, which is equivalent to increasing the contact area of the heat sink 10 and the heat source. Thus, the heat dissipation efficiency of the heat sink 50 is improved.

Figure 22:
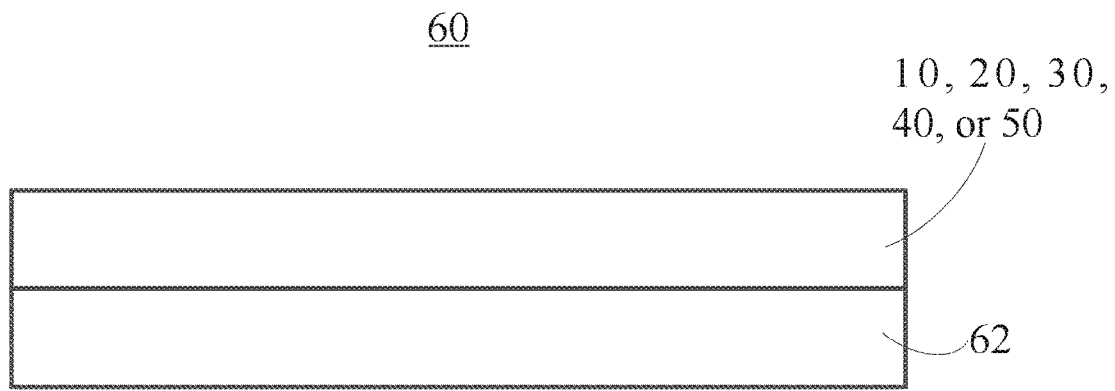
FIG. 22 shows a schematic view of a sixth embodiment of an electronic device.

Referring to FIG. 22, an electronic device 60 of a sixth embodiment includes a heat generating element 62 and one of the heat sinks 10, 20, 30, 40, 50. One of the heat sinks 10, 20, 30, 40, 50 is located on the heat generating element 62. One of the heat sinks 10, 20, 30, 40, 50 can be in direct contact with the heat generating element 62. One of the heat sinks 10, 20, 30, 40, 50 can be adhered to the heat generating element 62 by thermal conductive adhesive. The electronic device 60 includes a mobile phone, a tablet computer, or the like. In one embodiment, the electronic device 60 is a micro device.

When the temperature of the heat generating element 62 is low or the electronic device 60 is in a low power standby state, the heat sinks 10, 20, 30, 40, 50 can quickly absorb moisture from the air. When the temperature of the heat generating element 62 increases or the electronic device 60 is operated at high power, heat is generated, so that the moisture absorbed by the heat sinks 10, 20, 30, 40, 50 is evaporated, thereby dissipating the heat. When the electronic device 60 is continuously operated, the heat sinks 10, 20, 30, 40, 50 can absorb moisture from the air and evaporate water alternately. Thus, a continuously absorb water—evaporate water-absorb water—evaporate water mode is formed. Thus, heat is constantly being dissipated.

In addition, the outer casing of the electronic device 60 has a plurality of through holes, increasing air circulation.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. A heat sink, comprising:
a carbon nanotube structure comprising carbon nanotubes, wherein the carbon nanotube structure is a freestanding structure; and
calcium chloride particles deposited on outer surfaces of each of the carbon nanotubes and forming a calcium chloride layer, wherein each of the carbon nanotubes and the calcium chloride layer form a composite tubular structure, gaps between each adjacent two of the composite tubular structures are defined, and the gaps are empty.

2. The heat sink of claim 1, wherein the carbon nanotubes are joined end-to-end by van der Waals attractive force and extend along a same direction.

3. The heat sink of claim 1, wherein the calcium chloride particles are calcium chloride hexahydrate particles.

4. The heat sink of claim 1, wherein a mass ratio of the calcium chloride particles to the carbon nanotubes is in a range from 4:1 to 64:1.

5. The heat sink of claim 1, wherein the carbon nanotube structure is a carbon nanotube array, the carbon nanotube array is a sheet, and extending directions of the carbon nanotubes are perpendicular to a surface of the sheet.

6. The heat sink of claim 5, further comprises a fixing layer at one end of the carbon nanotubes, wherein a portion of each of the carbon nanotubes is embedded in the fixing layer, and a remaining portion of each of the carbon nanotubes extends out of the fixing layer.

7. The heat sink of claim 6, wherein the carbon nanotubes extending out of the fixing layer defines a pattern of the carbon nanotube array.

8. The heat sink of claim 1, wherein the carbon nanotubes are entangled with each other.

9. The heat sink of claim 1, wherein the carbon nanotube structure comprises a first drawn carbon nanotube film and a second drawn carbon nanotube film stacked on each other, the first drawn carbon nanotube film comprises first carbon nanotubes joined end-to-end by van der Waals attractive force and extending substantially along a first direction, the second drawn carbon nanotube film comprises second carbon nanotubes joined end-to-end by van der Waals attractive force and extending substantially along a second direction, and an angle between the first direction and the second direction is approximately 90 degrees; and a mass ratio of the calcium chloride particles to the carbon nanotubes is approximately 63.42 to 1.

10. An electronic device, comprising:
a heat generating element; and
a heat sink on the heat generating element, wherein the heat sink comprises:
a carbon nanotube structure comprising carbon nanotubes, wherein the carbon nanotube structure is a freestanding structure; and
calcium chloride particles deposited on outer surfaces of each of the carbon nanotubes and forming a calcium chloride layer, wherein each of the carbon nanotubes and the calcium chloride layer form a composite tubular structure, gaps between each adjacent two of the composite tubular structures are defined, and the gaps are empty.

11. The electronic device of claim 10, wherein the carbon nanotubes are joined end-to-end by van der Waals attractive force and extend along a same direction.

12. The electronic device of claim 10, wherein the carbon nanotube structure comprises a first drawn carbon nanotube film and a second drawn carbon nanotube film stacked on each other, the first drawn carbon nanotube film comprises first carbon nanotubes joined end-to-end by van der Waals attractive force and extending substantially along a first direction, the second drawn carbon nanotube film comprises second carbon nanotubes joined end-to-end by van der Waals attractive force and extending substantially along a second direction, and an angle between the first direction and the second direction is approximately 90 degrees.

13. The electronic device of claim 10, wherein the calcium chloride particles are calcium chloride hexahydrate particles.

14. The electronic device of claim 10, wherein the carbon nanotube structure is a carbon nanotube array, the carbon nanotube array is a sheet, and extending directions of the carbon nanotubes are perpendicular to a surface of the sheet.

15. The electronic device of claim 14, further comprises a fixing layer at one end of the carbon nanotubes, wherein a portion of each of the carbon nanotubes is embedded in the fixing layer, and a remaining portion of each of the carbon nanotubes extends out of the fixing layer.

16. The electronic device of claim 15, wherein the carbon nanotubes extending out of the fixing layer defines a pattern of the carbon nanotube array.

17. The electronic device of claim 10, wherein the carbon nanotubes are entangled with each other.

18. The electronic device of claim 15, wherein a melting point of the fixing layer is less than a maximum temperature of the heat generating element.

19. The electronic device of claim 10, further comprising a metal plate located between the heat sink and the heat generating element.

20. The electronic device of claim 19, wherein a contact surface between the metal plate and the heat sink is greater than or equal to a contact surface between the metal plate and the heat generating element.

* * * * *